(12) United States Patent
Derksen et al.

(10) Patent No.: US 6,841,747 B2
(45) Date of Patent: Jan. 11, 2005

(54) SYSTEM AND METHOD FOR MOTOR CONTROLLER WITH A REVERSIBLE HOUSING BASE

(75) Inventors: James Derksen, Blommingdale, IL (US); Patrick Mo, Chicago, IL (US)

(73) Assignee: Siemens Energy & Automation, Inc., Alpharetta, GA (US)

( * ) Notice: Subject to any disclaimer, the term of this patent is extended or adjusted under 35 U.S.C. 154(b) by 22 days.

(21) Appl. No.: 10/252,636

(22) Filed: Sep. 23, 2002

(65) Prior Publication Data

US 2004/0055859 A1 Mar. 25, 2004

(51) Int. Cl.[7] ................................................ H01H 9/06
(52) U.S. Cl. ...................................... 200/293; 200/296
(58) Field of Search ................................. 200/293, 294, 200/296, 297, 298, 306, 307

(56) References Cited

U.S. PATENT DOCUMENTS

| | | | | |
|---|---|---|---|---|
| 3,676,623 A | * | 7/1972 | Hollister et al. | 218/17 |
| 3,678,422 A | * | 7/1972 | Reimer | 335/112 |
| 3,958,095 A | * | 5/1976 | Zaffrann et al. | 200/293 |
| 4,332,990 A | * | 6/1982 | Stevens | 200/314 |
| 4,356,368 A | * | 10/1982 | Osika | 200/307 |
| 4,679,728 A | * | 7/1987 | Gregory | 237/1 R |
| 4,816,961 A | * | 3/1989 | Saulgeot et al. | 361/142 |
| 6,118,091 A | * | 9/2000 | Matsumoto et al. | 200/293 |

FOREIGN PATENT DOCUMENTS

| | | |
|---|---|---|
| DE | 101 01 086 A1 | 7/2001 |
| EP | 0 924 845 A2 | 6/1999 |
| EP | 1 037 515 A2 | 9/2000 |

OTHER PUBLICATIONS

PCT, International Search Report mailed Jan. 22, 2004.

* cited by examiner

*Primary Examiner*—Kyung Lee

(57) ABSTRACT

Broadly, there is disclosed in accordance with a first aspect of the invention a reversible housing base for a motor controller having controllable switches of selectable size and bus bars having size selected according to switch size. The reversible housing base comprises a front wall, a rear wall and opposite side walls. The side walls are connected to the front and rear walls in a rectangular configuration to surround the switches and to define a top surface and an opposite bottom surface. The front and rear wall top surface each has a set of slots of a first size to support a first size of bus bars and the front and rear wall bottom surface each has a set of slots of a second size to support a second size of bus bars. The orientation of the housing base is reversible according to size of the bus bars.

22 Claims, 7 Drawing Sheets

SYSTEM AND METHOD FOR MOTOR CONTROLLER WITH A REVERSIBLE HOUSING BASE

CROSS REFERENCE TO RELATED PATENT APPLICATIONS

The present U.S. Patent Application has at least one common inventor as U.S. patent application Ser. No. 10/252, 643 entitled "System and Method for Improved Motor Controller", (2002P14791US), and is filed with the U.S. Patent and Trademark Office concurrently on Sep. 23, 2002, the entirety of which is incorporated herein by reference.

FIELD OF THE INVENTION

This invention relates to a motor controller and more particularly, a system and method for a motor controller with a reversible housing base.

BACKGROUND OF THE INVENTION

Solid state starters/controllers have found widespread use for controlling application of power to an AC induction motor. The conventional starter/controller, referred to hereinafter as simply a controller, uses solid state switches for controlling application of AC line voltage to the motor. The switches may be thyristors, such as silicon controlled rectifiers (SCRs) or triacs. The controller typically includes heat sinks associated with the SCR's for dissipating heat. A housing base surrounds the SCRs. The housing base may support a set of bus bars which carry current into and out of the controller. Controllers come in many different configurations that have different sizes of SCR's and bus bars to accommodate different current requirements. The size differences relate to current capacity and also physical size and usually require different housing parts to fit with each size. For example, a housing configured to support one size bus bar will not support another size bus bar. As a result a manufacturer typically provides multiple different sizes and configurations of the housing base resulting in higher costs and higher inventory requirements.

SUMMARY OF THE INVENTION

In accordance with the invention, a reversible housing base can accommodate different size bus bars in different configurations.

Broadly, there is disclosed in accordance with a first aspect of the invention a reversible housing base for a motor controller having controllable switches of selectable size and bus bars having size selected according to switch size. The reversible housing base comprises a front wall, a rear wall and opposite side walls. The side walls are connected to the front and rear walls in a rectangular configuration to surround the switches and to define a top surface and an opposite bottom surface. The front and rear wall top surface each has a set of slots of a first size to support a first size of bus bars and the front and rear wall bottom surface each has a set of slots of a second size to support a second size of bus bars. The orientation of the housing base is reversible according to size of the bus bars.

It is a feature of the invention that the housing base is of one piece plastic construction.

It is another feature of the invention that one of the side walls includes a set of slots on the top surface and the other of the side walls includes a set of slots on the bottom surface to support a set of bypass bus bars according to orientation of the housing base.

It is a further feature of the invention that the first size of slots supports a relatively large bus bar cross section and the second size of slots supports a relatively small bus bar cross section.

It is still another feature of the invention that the housing base is stackable with another reversible housing base for use with relatively large size switches.

There is disclosed in accordance with another aspect of the invention a motor controller comprising a plurality of controllable switches of selectable size. A pair of bus bars is connected to opposite sides of each switch. The bus bars have a size selected according to switch size. A reversible housing surrounds the switches and includes a top surface and an opposite bottom surface. The top surface has a set of slots of a first size to support a first size of bus bars and the bottom surface has a set of slots of a second size to support a second size of bus bars. The orientation of the housing base is reversible according to size of the bus bars.

It is a feature of the invention to provide a heat sink and the switches and housing base are mounted to the heat sink.

There is disclosed in accordance with yet another aspect of the invention a method of assembling a motor controller. The method comprises selecting a plurality of controllable switches having a size to satisfy power requirements; selecting a plurality of bus bars, the bus bars having a size selected according to switch, size; providing a reversible housing base including a top surface and an opposite bottom surface, the top surface having a first set of slots of a first size to support a first size of bus bars and the bottom surface having a second set of slots of a second size to support a second size of bus bars; mounting the reversible housing base to surround the switches, the orientation of the housing base being selected according to size of the bus bars; and mounting the bus bars to the switches and supported on the first set of slots or the second set of slots according to orientation of the reversible housing base.

Further features and advantages of the invention will be readily apparent from the specification and from the drawings.

DETAILED DESCRIPTION OF THE INVENTION

Figure 1:
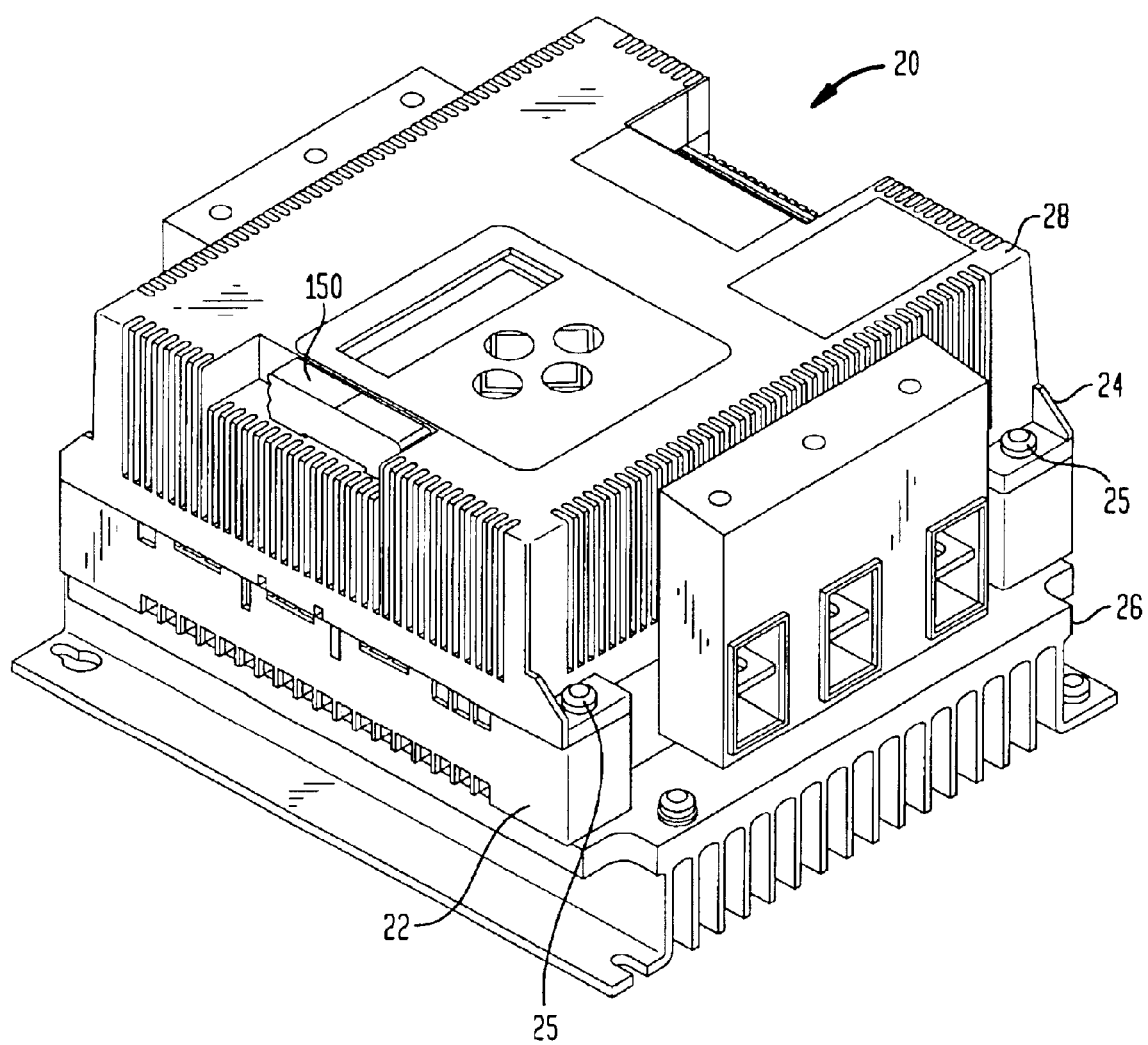
FIG. 1 is a perspective view of a motor controller in accordance with the invention.

Referring initially to FIG. 1, a motor controller 20 in the form of a solid state starter/controller 20 is illustrated. Particularly, the motor controller 20 includes a reversible housing base 22 in accordance with the invention. One application for the controller 20 is as an elevator starter. The motor controller 20 may be used to drive a pump for an hydraulic elevator. Each time movement of an elevator car is commanded, then the motor controller 20 must start the elevator motor until it reaches operating speed and then operate in a run mode. Such a motor controller 20 may only be used for the up direction as gravity may be used for the down direction.

Figure 2:
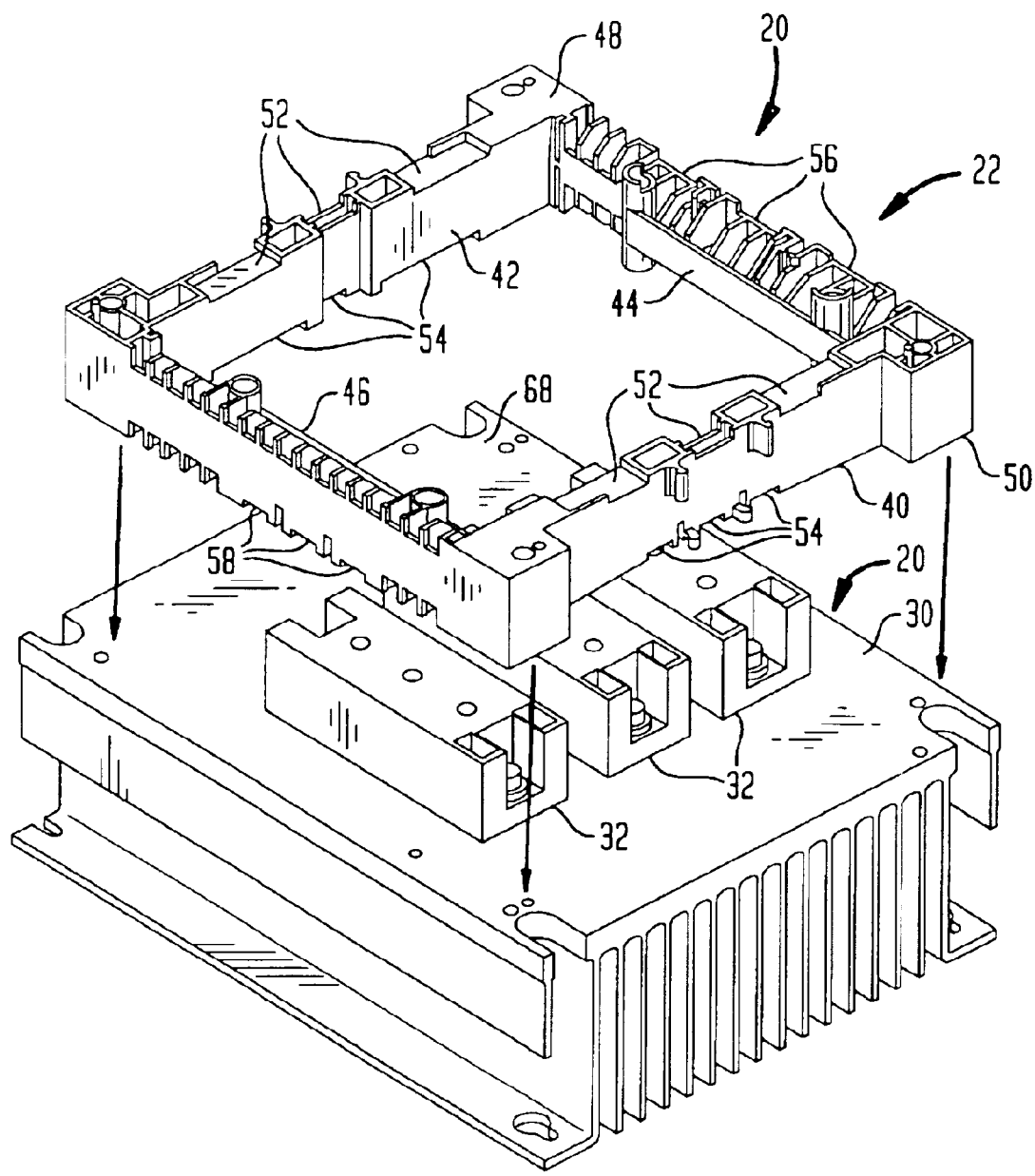
FIG. 2 is an exploded perspective view illustrating a heat sink, switches and reversible housing base of the motor controller of FIG. 1.

The motor controller 20 comprises a housing 24 including the housing base 22, a heat sink 26 and a cover 28. Referring also to FIG. 2, the heat sink 26 comprises an aluminum extrusion having a planar top surface 30. The motor controller 20 includes a plurality of solid state switches 32 in the form of thyristors, such as back to back connected silicon controlled rectifier (SCR) pairs, see FIG. 2. For simplicity herein, the SCR pairs 32 are referred to as simply SCRs. Triacs could also be used. The SCRs 32 control application of three phase AC line voltage to a three phase motor. As is apparent, a different number of SCRs 32 could be used to control different numbers of phases, as is apparent to those skilled in the art.

Figure 3:
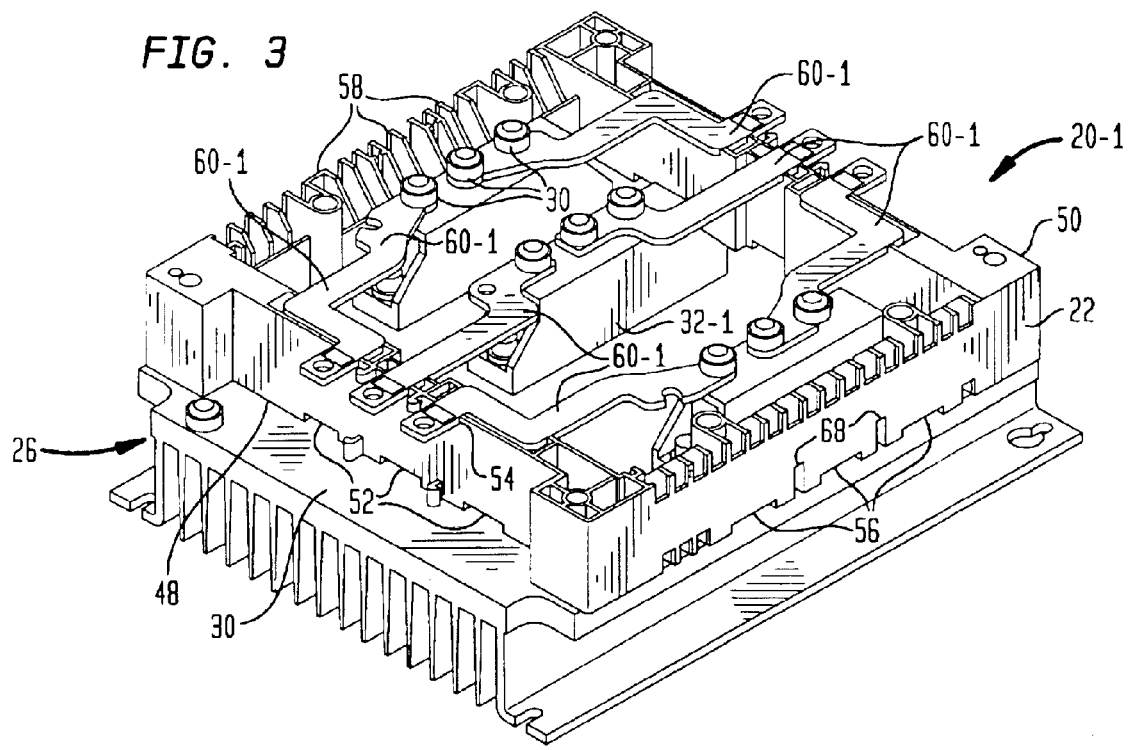
FIG. 3 is a perspective view of a portion of the motor controller of FIG. 1 illustrating a heat sink, switches, the reversible housing base and bus bars in a first configuration.
Figure 4:
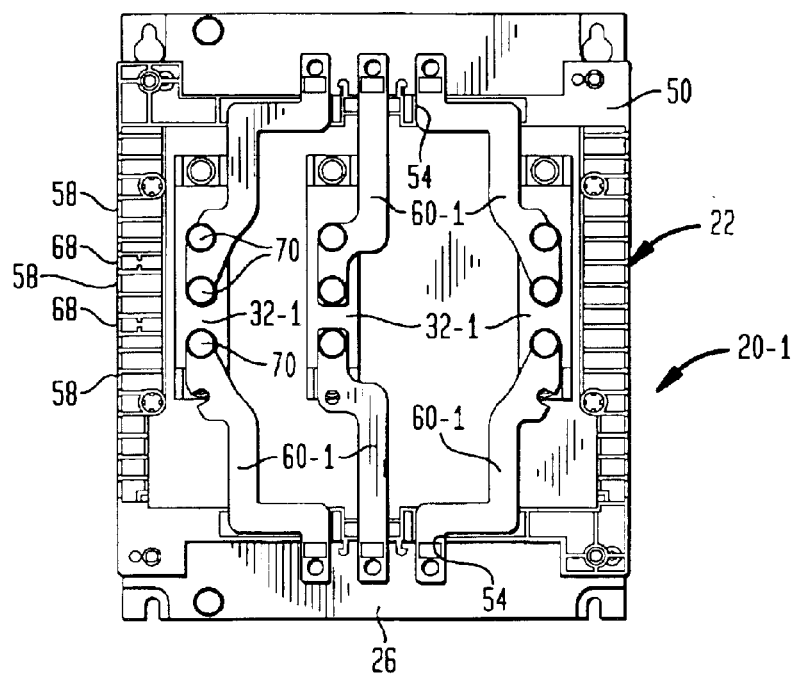
FIG. 4 is a plan view of the controller portion of FIG. 3.
Figure 5:
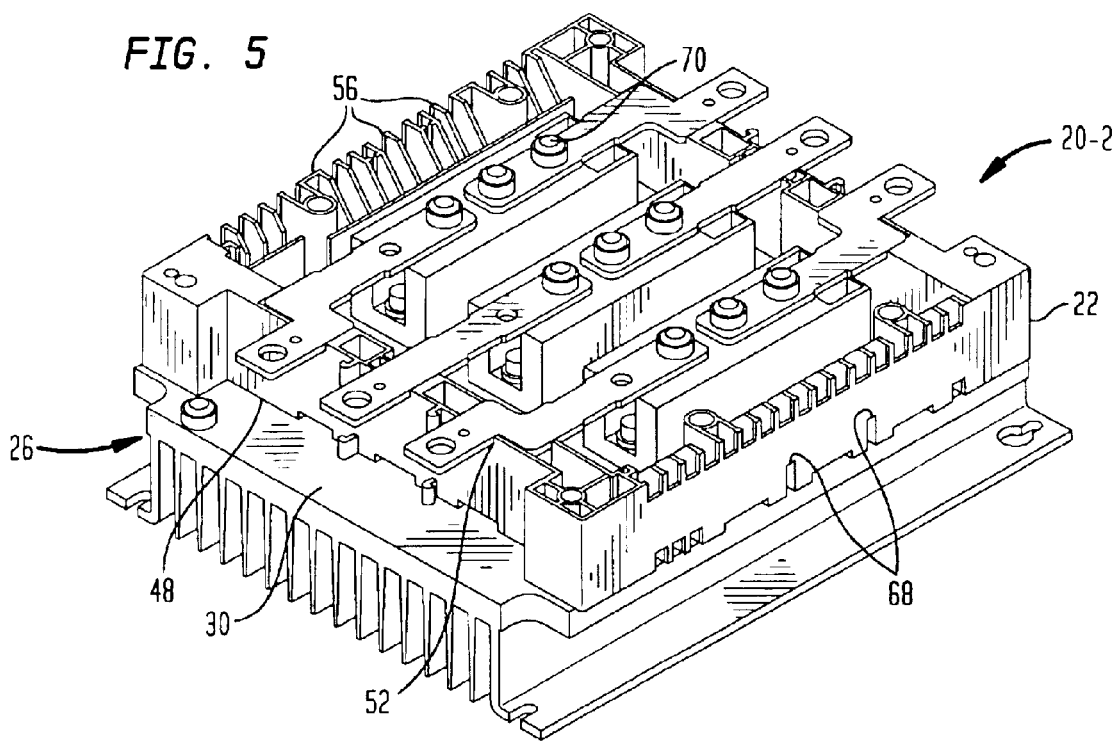
FIG. 5 is a perspective view of a portion of the motor controller of FIG. 1 illustrating a heat sink, switches, the reversible housing base and bus bars in a second configuration.
Figure 6:
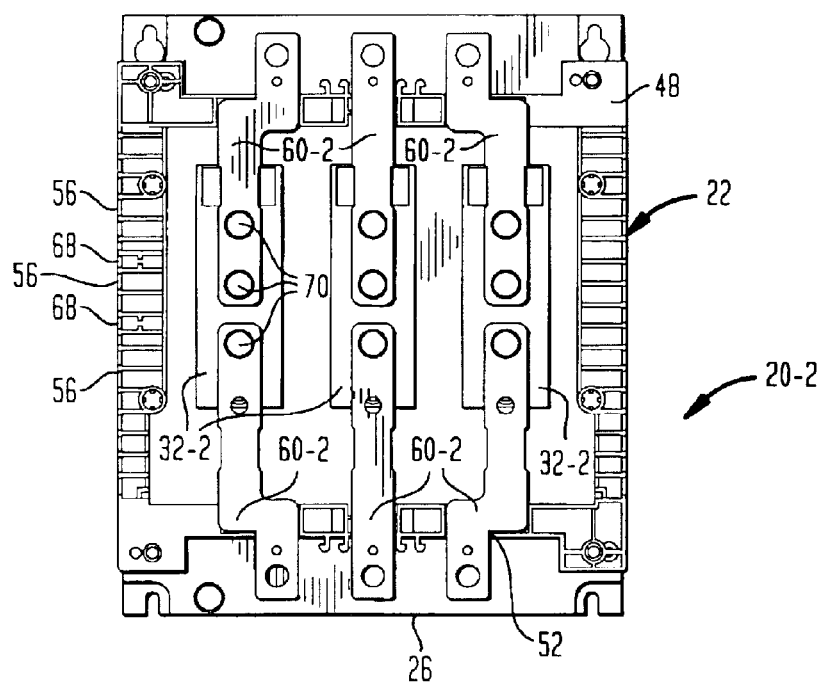
FIG. 6 is a plan view of the controller portion of FIG. 5.
Figure 7:
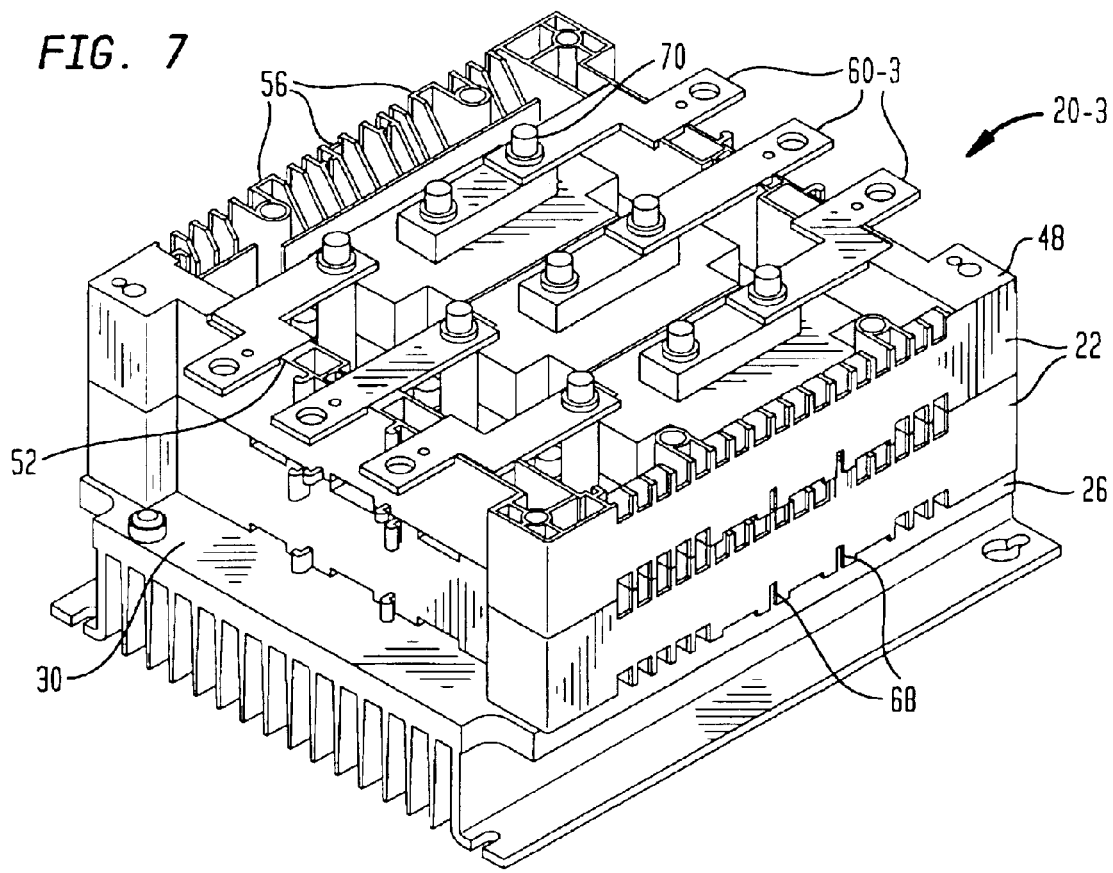
FIG. 7 is a perspective view of a portion of the motor controller of FIG. 1 illustrating a heat sink, switches, the reversible housing base and bus bars in a third configuration.
Figure 8:
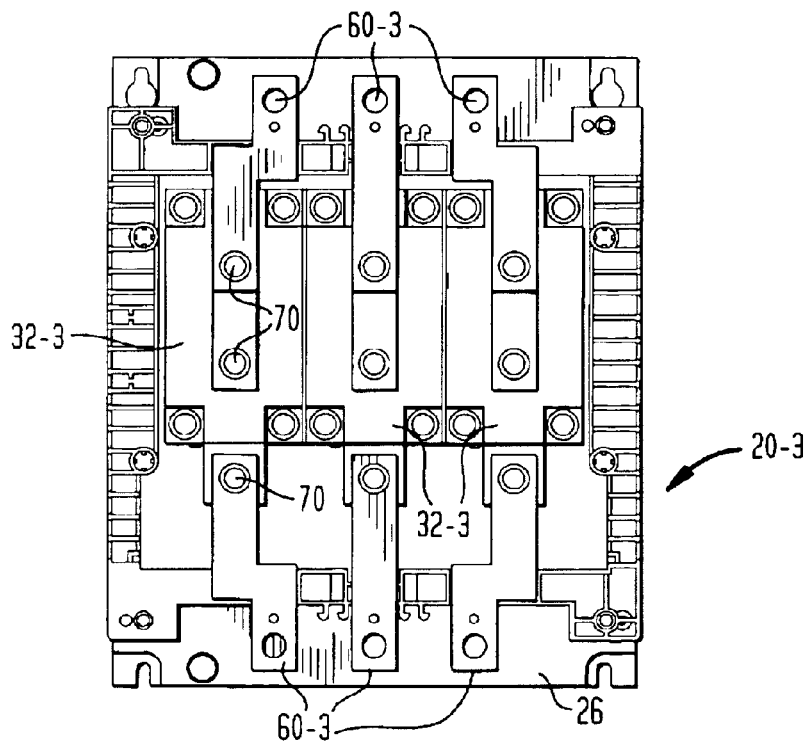
FIG. 8 is a plan view of the controller portion of FIG. 7.
Figure 9:
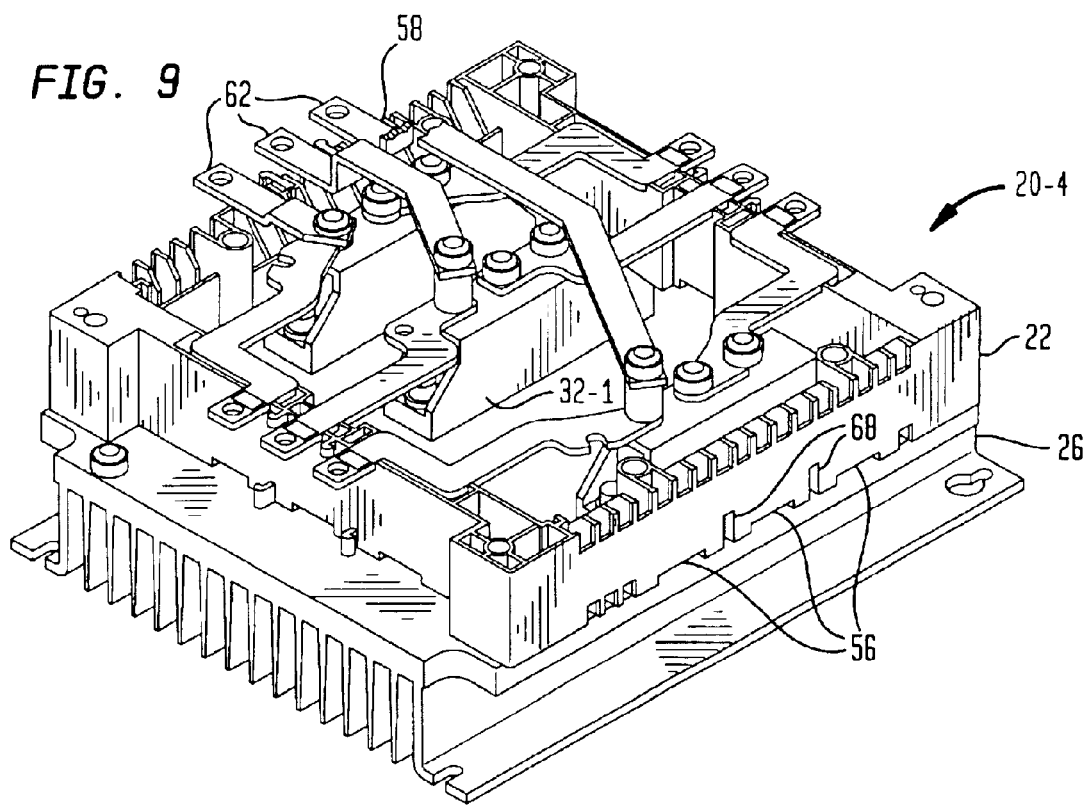
FIG. 9 is a perspective view of a portion of the motor controller of FIG. 1 illustrating a heat sink, switches, the reversible housing base and bus bars in a fourth configuration.
Figure 10:
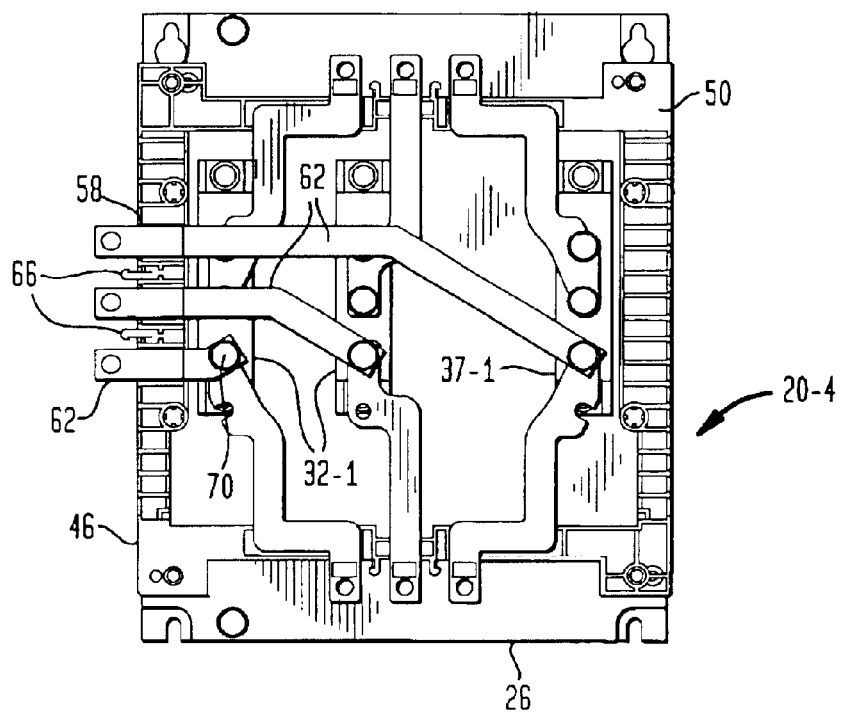
FIG. 10 is a plan view of the controller portion of FIG. 9.
Figure 11:
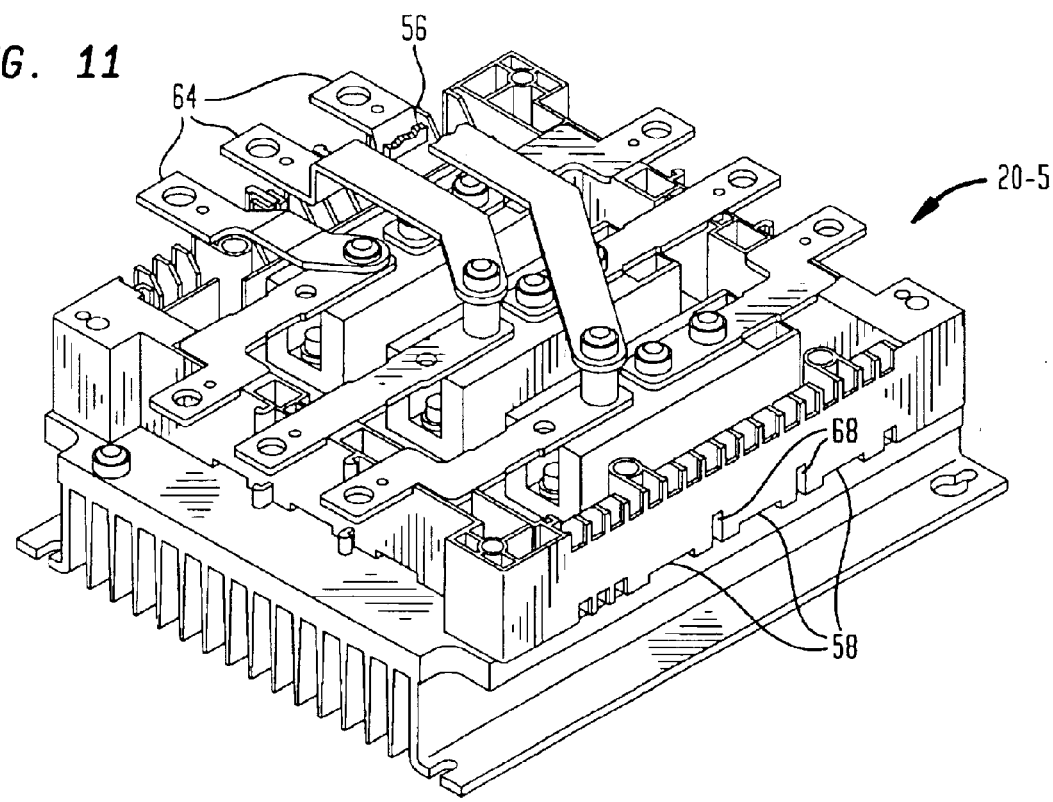
FIG. 11 is a perspective view of a portion of the motor controller of FIG. 1 illustrating a heat sink, switches, the reversible housing base and bus bars in a fifth configuration.
Figure 12:
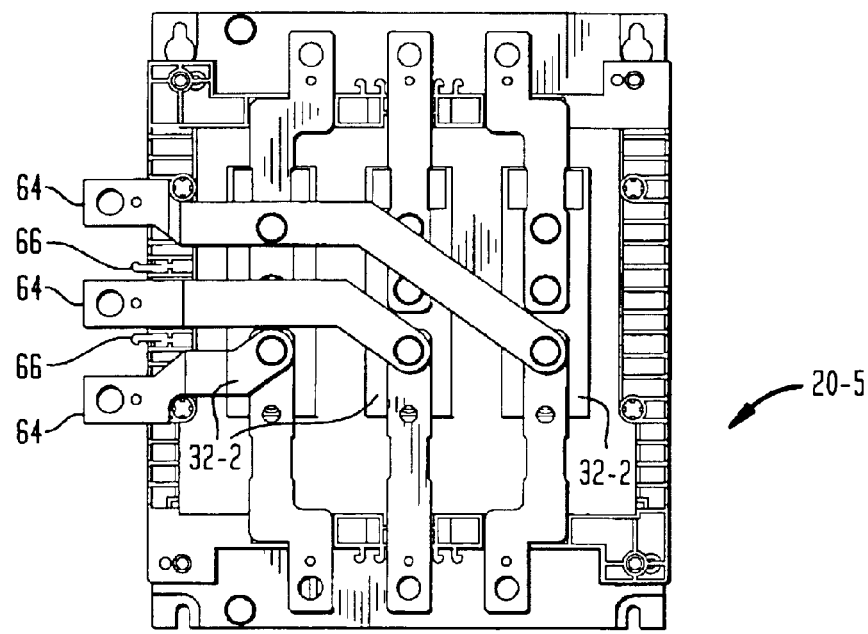
FIG. 12 is a plan view of the controller portion of FIG. 11.

The motor controller 20 is intended to satisfy different current control requirements. As such, the SCRs 32 may be of different sizes. The size differences relate to current capacity and also physical size. Different size SCRs require different bus bar sizes for connection to supply line terminals and motor terminals. The present application relates to the housing base 22 being reversible for use with a family of motor controllers using different size SCRs and bus bars. For example, as described more particularly below, FIGS. 3 and 4 illustrate a configuration with relatively small SCRs for controlling current in a range of 22 to 68 amps; FIGS. 5 and 6 illustrate a medium size SCR for controlling current in a range of 80 to 168 amps; and FIGS. 7 and 8 illustrate a relatively large size SCRs for controlling current on the order of 252 amps. Each size SCR uses a different size bus bar, as described below. Additionally, FIGS. 9 and 10 illustrate a configuration similar to that in FIGS. 3 and 4 with the addition of bypass bus bars; while FIGS. 11 and 12 illustrate the configuration of FIGS. 5 and 6 with the addition of bypass bus bars. As such, the reversible housing base 22 can accommodate at least five different configurations of SCRs and bus bar sizes in the illustrated embodiment of the invention.

The different current ranges and corresponding sizes discussed above are intended to be exemplary and the claimed invention is not limited to these specific sizes or ranges.

Referring particularly to FIG. 2, the reversible housing base 22 is of one piece plastic construction and may be formed, as by molding of glass filled nylon. The housing base 22 includes a front wall 40, a rear wall 42 and opposite side walls 44 and 46. The side walls 44 and 46 are connected to ends of the front wall 40 and the rear wall 42 in a rectangular configuration to surround the SCRs 32. The housing base 22 has a top surface 48 and an opposite bottom surface 50. The front and rear wall top surface 48 each has a first set of three slots 52 of a first size to support a first size of bus bars. The front and rear wall bottom surface 50 each has a second set of slots 54 of a second size to support a second size of bus bars. Particularly, the first set of slots 52 supports a relatively large bus bar cross section and the second set of slots 54 supports a relatively small bus bar cross section. Additionally, the first side wall 44 includes a third set of slots 56 on the top surface 48 to support a set of bypass bus bars. The second side wall 46 includes a fourth set of slots 58 on the bottom surface 50 to support a set of bypass bus bars. As above, the third set of slots 56 supports a relatively large bypass bus bar cross section and the fourth set of slots 58 supports a relatively small bypass bus bar cross section.

As is apparent, the housing base 22 is formed of relatively thin walls including rib structure there between, as necessary, to enhance moldability of the housing base 22 by minimizing use of materials while maintaining necessary strength and rigidity. However, the complete details of the structure of the reversible housing base 22 are not necessary for understanding the invention disclosed herein.

The following description of the five configurations shown in FIGS. 3–12 illustrates how the reversible housing base 22 is used in different configuration motor controllers. For simplicity, each configuration is identified with distinct components using a suffix identifying the configuration number. Common elements used in all configurations, such as the heat sink 26 and housing base 22 are identified without use of any suffix.

Referring initially to FIGS. 3 and 4, a motor controller 20-1 using relatively small SCRs 32-1 is illustrated. The SCRs 32-1 may be used for controlling current in the range of 22 to 68 amps, for example. The SCRs 32-1 are mounted to the heat sink 26 in a conventional manner. The reversible housing base 22 surrounds the SCRs 32-1 and is mounted to the heat sink 26 using threaded fasteners 25, see FIG. 1. A pair of bus bars 60-1 is electrically connected to opposite sides of each SCR 32-1 using fasteners 70. The bus bars 60-1 have a relatively small cross section owing to the relatively low current requirements of the SCRs 32-1. The bus bars 60-1 for the different SCRs 32-1 have different shapes according to position of the SCRs 32-1 relative to the set of slots 54. In this configuration, the reversible housing base 22 is mounted to the heat sink 26 with the bottom surface 50 facing upwardly so that the bus bars 60-1 are supported in the second sets of slots 54. As such, the top surface 48 rests on the heat sink top surface 30 and the first set of slots 52 is not used. As is apparent, the reversible housing base 22 is turned over relative to the orientation shown in FIG. 2. In this configuration, the fourth set of slots 58 faces upwardly, although they are not used.

Referring to FIGS. 5 and 6, a motor controller 20-2 according to a second configuration is illustrated. The motor controller 20-2 uses medium size SCRs 32-2 which may control current, for example, in the range of 80 amps to 168 amps. A pair of bus bars 60-2 is electrically connected to opposite sides of each SCR 32-2 using the fasteners 70. The bus bars 60-2 have a relatively large bus bar cross section compared to the bus bars 60-1 of FIGS. 3 and 4. Particularly, the bus bar 60-2 have a larger cross section than the bus bar 60-1 of FIGS. 3 and 4 owing to the higher current requirements of the SCRs 32-2. The bus bars 60-2 for the different SCRs 32-2 have different shapes according to position of the SCRs 32-2 relative to the set of slots 52.

In the configuration of FIGS. 5 and 6, the reversible housing base 22 is mounted to the heat sink 26, with the bottom surface 50 resting on the heat sink top surface 30 and the top surface 48 facing upwardly. As such, the bus bars 60-2 are supported in the first sets of slots 52. Likewise, the third set of slots 56 faces upwardly although they are not used in this configuration.

Referring to FIGS. 7 and 8, a motor controller 20-3 is illustrated. The motor controller 20-3 uses very large sized SCRs 32-3 that are configured to control current on the order of 252 amps. The SCRs 32-3 are of greater height than the SCRs 32-1 and 32-2 discussed above. As such, the motor controller 20-3 uses two reversible housing bases 22 stacked atop one another on the heat sink 30. Particularly, each reversible housing base 22 is mounted with its bottom surface 50 facing downwardly and its top surface 48 facing upwardly. A pair of bus bars 60-3 is connected to opposite of each SCR 32-3. The bus bars 60-3 are of a relatively large cross section, similar to the bus bar 60-2, and are supported in the first set of slots 52. The bus bars 60-3 for the different SCRs 32-3 have different shapes according to position of the SCRs 32-3 relative to the set of slots 52.

FIGS. 9 and 10 illustrate a motor controller 20-4 which is identical to the motor controller 20-1 of FIGS. 3 and 4 with the addition of a set of bypass bus bars 62. The bypass bus bars are electrically connected to one side of the SCRs 32-1 and are supported in the fourth set of slots 58. The bypass bus bars 62 have a relatively small cross section.

Similarly, FIGS. 11 and 12 illustrate a motor controller 20-5 which is similar to the motor controller 20-2 of FIGS. 5 and 56 with the addition of a set of bypass bus bars 64. The bypass bus bars 64 have a relatively large cross section compared to the bypass bus bars 62 of FIGS. 9 and 10. The bypass bus bars 64 are electrically connected to one side of the SCRs 32-2 and are supported in the third set of slots 56.

In the embodiments of FIGS. 9-12, tabs 66 extend outwardly from the side walls 44 or 46. The tabs 66 are removably inserted into side slots 68 between the third and fourth sets of slots 56 and 58, as illustrated in FIGS. 4 and 6. The tabs 66 are used to hold a wire clamp (not shown) to the housing base 22. These tabs can be used with any size of bus bar.

Thus, in accordance with the invention, a reversible housing base 22 is used to support a set of bus bars which carry current into and out of a motor controller. In the illustrated embodiment three bus bar sizes can be accommodated by using the reversible housing base 22 in different configurations. A lower manufactured cost motor controller 20 is possible because of the larger volume of a single part and use of fewer molds and lower inventory requirements due to fewer parts.

We claim:

1. A reversible housing base for a motor controller having controllable switches of selectable size and bus bars having size selected according to switch size, comprising:
   a front wall, a rear wall and opposite side walls, the side walls being connected to the front wall and the rear wall in a rectangular configuration to surround the switches and to define a top surface and an opposite bottom surface, the front and rear wall top surface each having a set of slots of a first size to support a first size of bus bars and the front and rear wall bottom surface each having a set of slots of a second size to support a second size of bus bars, the orientation of the housing base being reversible according to size of the bus bars.

2. The reversible housing base of claim 1 wherein the housing base is of one piece plastic construction.

3. The reversible housing base of claim 1 wherein one of the side walls includes a set of slots on the top surface and the other of the side walls includes a set of slots on the bottom surface to support a set of bypass bus bars according to orientation of the housing.

4. The reversible housing base of claim 1 wherein the first size of slots supports a relatively large bus bar cross section and the second size of slots supports a relatively small bus bar cross section.

5. The reversible housing base of claim 1 wherein the housing base is stackable with another reversible housing base for use with relatively large size switches.

6. A motor controller comprising:
   a plurality of controllable switches of selectable size;
   a pair of bus bars connected to opposite sides of each said switch, the bus bars having a size selected according to switch size; and
   a reversible housing surrounding the switches including a top surface and an opposite bottom surface, the top surface having a set of slots of a first size to support a first size of bus bars and the bottom surface having a set of slots of a second size to support a second size of bus bars, the orientation of the housing base being reversible according to size of the bus bars.

7. The motor controller of claim 6 wherein the reversible housing includes a front wall, a rear wall and opposite side walls, the side walls being connected to the front wall and the rear wall in a rectangular configuration to surround the switches and to define the top surface and the opposite bottom surface, the front and rear wall top surface each having the set of slots of the first size to support the first size of bus bars and the front and rear wall bottom surface each having the set of slots of the second size to support the second size of bus bars.

8. The motor controller of claim 7 wherein one of the side walls includes a set of slots on the top surface and the other of the side walls includes a set of slots on the bottom surface to support a set of bypass bus bars according to orientation of the housing.

9. The motor controller of claim 6 wherein the housing base is of one piece plastic construction.

10. The motor controller of claim 6 wherein the first size of slots supports a relatively large bus bar cross section and the second size of slots supports a relatively small bus bar cross section.

11. The motor controller of claim 6 comprising a pair of reversible housing bases and wherein the housing bases are stackable for use with relatively large size switches.

12. The motor controller of claim 6 further comprising a heat sink and wherein the switches and the housing base are mounted to the heat sink.

13. A motor controller comprising:
   a plurality of controllable switch means for selectively applying power to a winding of a motor, each switch means being of a selectable size;
   a pair of bus bars connected to opposite sides of each said switch means, the bus bars having a size selected according to switch size; and
   a reversible housing base surrounding the switch means including first means for supporting a first size of bus bars and second means for supporting a second size of bus bars, the orientation of the housing base being reversible relative to the switch means according to size of the bus bars.

14. The method of assembling a motor controller comprising:

selecting a plurality of controllable switches having a size to satisfy power requirements;

selecting a plurality of bus bars, the bus bars having a size selected according to switch size; and providing a reversible housing base including a top surface and an opposite bottom surface, the top surface having a first set of slots of a first size to support a first size of bus bars and the bottom surface having a second set of slots of a second size to support a second size of bus bars;

mounting the reversible housing base to surround the switches, the orientation of the housing base being selected according to size of the bus bars; and mounting the bus bars to the switches and supported on first set of slots or the second set of slots according to orientation of the reversible housing base.

15. The method of assembling a motor controller of claim 14 wherein the reversible housing includes a front wall, a rear wall and opposite side walls, the side walls being connected to the front wall and the rear wall in a rectangular configuration to surround the switches and to define the top surface and the opposite bottom surface, the front and rear wall top surface each having the first set of slots of the first size to support the first size of bus bars and the front and rear wall bottom surface each having the second set of slots of the second size to support the second size of bus bars.

16. The method of assembling a motor controller of claim 14 wherein one of the side walls includes a third set of slots on the top surface and the other of the side walls includes a fourth set of slots on the bottom surface and further comprising providing a set of bypass bus bars supported on the third or fourth set of slots according to orientation of the housing.

17. The method of assembling a motor controller of claim 14 further comprising providing a pair of reversible housing bases and wherein the housing bases are stacked for use with relatively large size switches.

18. The method of assembling a motor controller of claim 14 further comprising mounting a cover to the reversible housing base.

19. A reversible housing base for a motor controller, comprising:

a front wall, a rear wall and opposite side walls, the side walls being connected to the front wall and the rear wall in a rectangular configuration to define a top surface and an opposite bottom surface, the front and rear wall top surface each having a set of slots of a first size to support a first size of bus bars and the front and rear wall bottom surface each having a set of slots of a second size to support a second size of bus bars, the orientation of the housing base being reversible according to size of the bus bars.

20. The reversible housing base of claim 19 wherein the housing base is of one piece plastic construction.

21. A reversible housing base for an elevator starter having controllable switches of selectable size and bus bars having size selected according to switch size, comprising:

a front wall, a rear wall and opposite side walls, the side walls being connected to the front wall and the rear wall in a rectangular configuration to surround the switches and to define a top surface and an opposite bottom surface, the front and rear wall top surface each having a set of slots of a first size to support a first size of bus bars and the front and rear wall bottom surface each having a set of slots of a second size to support a second size of bus bars, the orientation of the housing base being reversible according to size of the bus bars.

22. The reversible housing base of claim 21 wherein the housing base is of one piece plastic construction.

* * * * *